(12) United States Patent
Anan et al.

(10) Patent No.: US 10,627,354 B2
(45) Date of Patent: Apr. 21, 2020

(54) SUBSTITUTION SITE MEASURING EQUIPMENT AND SUBSTITUTION SITE MEASURING METHOD

(71) Applicant: Hitachi, Ltd., Chiyoda-ku, Tokyo (JP)

(72) Inventors: Yoshihiro Anan, Tokyo (JP); Masanari Koguchi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/066,987

(22) PCT Filed: Jul. 26, 2016

(86) PCT No.: PCT/JP2016/071810
§ 371 (c)(1),
(2) Date: Jun. 28, 2018

(87) PCT Pub. No.: WO2018/020565
PCT Pub. Date: Feb. 1, 2018

(65) Prior Publication Data
US 2019/0017948 A1 Jan. 17, 2019

(51) Int. Cl.
*G01N 23/2252* (2018.01)
*G01N 23/225* (2018.01)
(Continued)

(52) U.S. Cl.
CPC ....... *G01N 23/2252* (2013.01); *G01N 23/223* (2013.01); *G01N 23/225* (2013.01);
(Continued)

(58) Field of Classification Search
USPC .......................................... 250/306
See application file for complete search history.

(56) References Cited

U.S. PATENT DOCUMENTS

| 5,497,008 A * | 3/1996 | Kumakhov | B82Y 10/00 250/505.1 |
| 7,989,843 B2 * | 8/2011 | Miki | H01L 21/02381 257/192 |

(Continued)

OTHER PUBLICATIONS

International Search Report (PCT/ISA/210) issued in PCT Application No. PCT/JP2016/071810 dated Oct. 11, 2016 with English translation (two (2) pages).
(Continued)

*Primary Examiner* — Phillip A Johnston
(74) *Attorney, Agent, or Firm* — Crowell & Moring LLP

(57) ABSTRACT

This substitution site measuring equipment using an electron beam analyzes, with high precision, the structure of a substitution site in a micrometer- to nanometer-order region, by reducing or vanishing the X-ray intensity of diffraction X-rays generated in a specimen. The substitution site measuring equipment measures a substitution site in a crystal by detecting, by means of an X-ray detector, X-rays generated from a specimen upon irradiation of the specimen with an electron beam. The substitution site measuring equipment is provided with: an input unit to which a crystal structure of a specimen, energy or wavelengths of X-rays to be detected, a tilt angle of the specimen, and positional information about the specimen and the X-ray detector are inputted; a diffraction X-ray incidence calculating means for calculating incidence of diffraction X-rays on the X-ray detector on the basis of parameters inputted to the input unit; a measurement condition setting means for setting a measurement condition according to the incidence of diffraction X-rays on the X-ray detector calculated by the diffraction X-ray incidence calculating means such that the diffraction X-rays are not incident on the X-ray detector; and an electron beam inclination/X-ray detection control unit that detects the X-rays in synchronization with the inclination of an electron beam.

13 Claims, 13 Drawing Sheets

(51) Int. Cl.
*H01J 37/00* (2006.01)
*G01N 23/223* (2006.01)
*G02B 27/09* (2006.01)
*H01J 37/244* (2006.01)
*H01J 37/26* (2006.01)

(52) U.S. Cl.
CPC .......... *G02B 27/0944* (2013.01); *H01J 37/00* (2013.01); *H01J 37/244* (2013.01); *H01J 37/261* (2013.01)

(56) References Cited

U.S. PATENT DOCUMENTS

| | | | |
|---|---|---|---|
| 8,373,968 B2 * | 2/2013 | Ishii | C01G 23/006 361/321.5 |
| 9,114,779 B2 * | 8/2015 | Allen | B60R 22/4628 |
| 9,752,997 B2 * | 9/2017 | Anan | G01N 23/225 |
| 2017/0038319 A1 * | 2/2017 | Kumar | G01N 23/223 |

OTHER PUBLICATIONS

Japanese-language Written Opinion (PCT/ISA/237) issued in PCT Application No. PCT/JP2016/071810 dated Oct. 11, 2016 (three (3) pages).

J. Tafφ and J. C. H. Spence, Atomic Site Determination Using the Channeling Effect in Eletron-Induce X-Ray Emission, Ultramicroscopy 9 (1982), pp. 243-247.

Ohtsuka M, et al., Quantitative determination of occupation sites of trace Co substituted for multiple Fe sites in M-type hexagonal ferrite using statistical beam-rocking TEM-EDXS analysis, Microscopy, 2016, vol. 65, No. 2, pp. 127-137.

Masahiro Otsuka et al., "Tokeiteki ALCHEMI-hoto Dorikigaku Keisan o Kumiawaseta Tenka Genso Sen'yu Site no Teiryo Hyoka", Abstracts of the Japan Institute of Metals, Sep. 10, 2014, pp. S1 to S10.

* cited by examiner

SPECIMEN TILT (SPECIMEN TILT MECHANISM)

FIG. 8
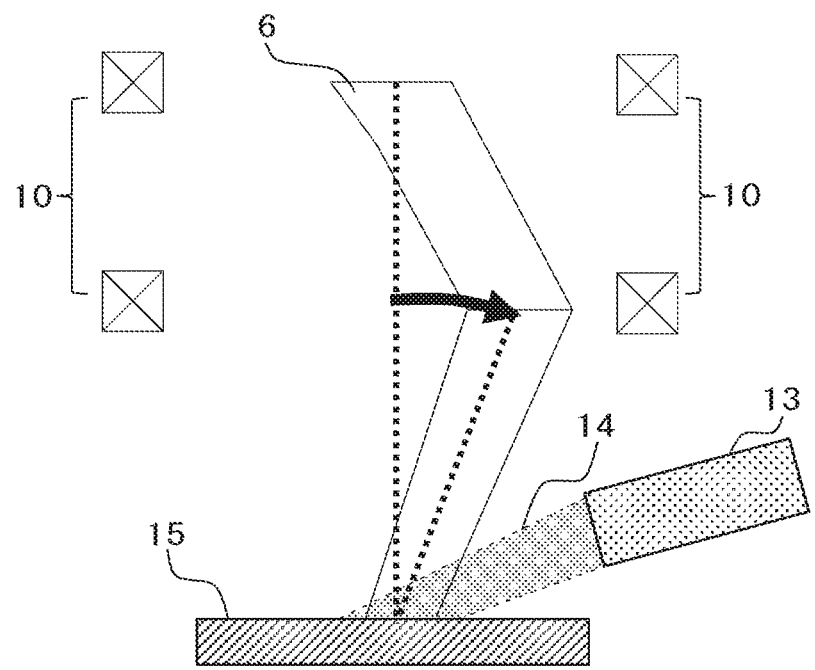
FIG. 9A
FIG. 9B
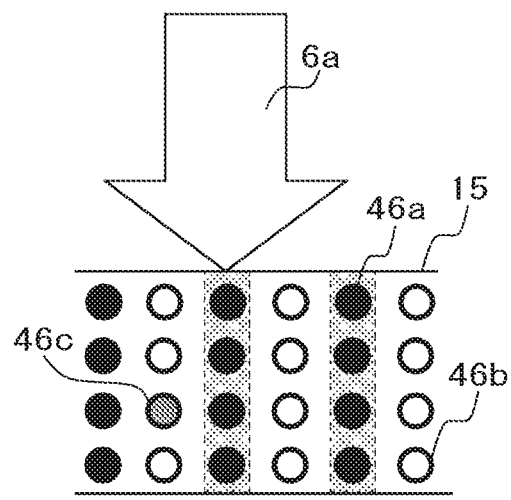
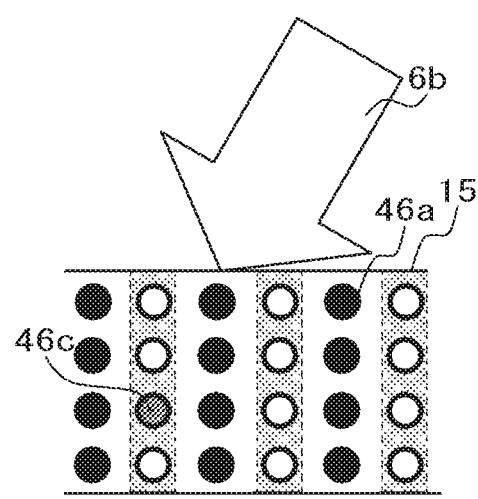

F I G . 1 2
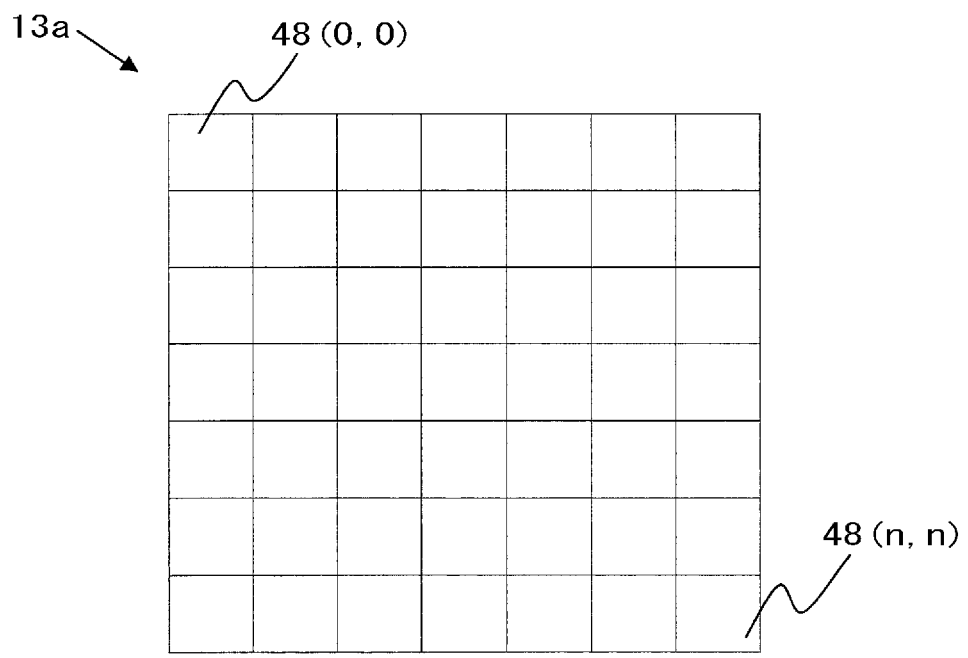

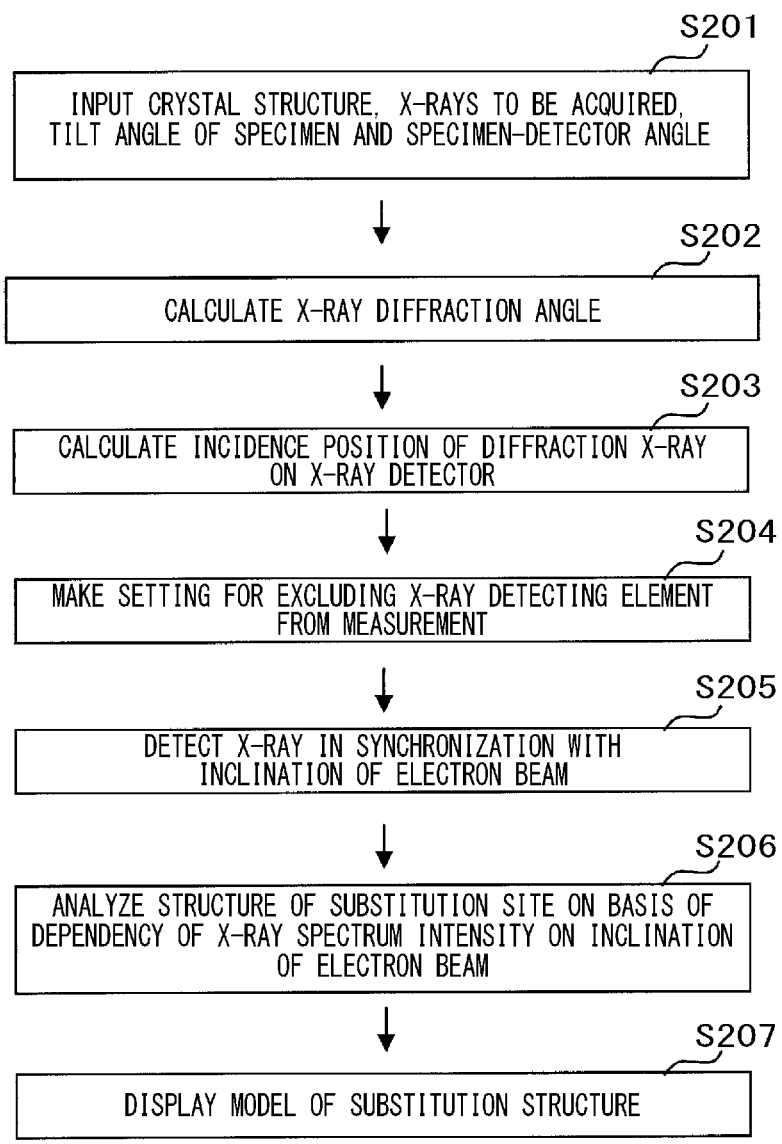

SUBSTITUTION SITE MEASURING EQUIPMENT AND SUBSTITUTION SITE MEASURING METHOD

TECHNICAL FIELD

The present invention relates to a technique for substitution site measurement in a microscopic and nanoscopic region using a charged particle beam. More particularly, the present invention relates to an equipment and method which employs a transmission electron microscope using an electron beam and accomplishes a high-precision measurement of substitution site by removing or reducing X-ray background generated from a specimen.

BACKGROUND ART

There is known a practice to add a dopant trace element to a material for the purpose of developing material function or improving high-temperature properties. Comprehension of the cause of functionality development requires substitution site measurement for determining whether or not the dopant element is substituted in a main phase and for determining in which site in a crystal structure of the main phase the dopant element is substituted. An example of crystal structure model having substitution sites is shown in FIG. 19. The figure shows an exemplary face-centered cubic structure where an A atom is located at an A site as each vertex of a unit lattice while a B atom is located at a B site as the center of each face. Further, a C atom is substituted in a C site (substitution site) as one of the B sites. Heretofore, the measurement of substitution site has been taken by means of synchrotron radiation XAFS (X-ray Absorption Fine Structure) or neutron diffraction. In the method using the radiation beam or neutron diffraction, a beam size ranging from several dozen micrometers to several millimeters makes it difficult to evaluate the measurement in a unit of micron-sized main phase. In a synchrotron radiation facility, on the other hand, the limitation of machine time makes it difficult to evaluate the substitution site measurement on a short TAT (Turn Around Time) basis.

In a method using a transmission electron microscope (TEM), the size of electron beam can be reduced to a nanometer order. Hence, the method permits the substitution site measurement on a micron-sized particle basis. Further, the method also permits the substitution site measurement on the short TAT basis for a laboratory measurement operation.

In the substitution site measurement using the electron beam, the substitution site measurement is taken on the basis of dependency of X-ray amount on incidence angle of electron beam, the X-ray generated from a specimen upon incidence of the electron beam on the specimen. When the electron beam is incident on the specimen, the electron beam interferes with transmitted waves and diffracted waves in the specimen (electron beam diffraction effect) so that standing waves of the electron are generated in the specimen. A large amount of X-ray is generated in an atomic row where the standing waves are generated. If the standing waves are generated in the row of A atoms in the case of an incidence azimuth 1, for example, a large amount of A-atom X-ray is generated. If the standing waves are generated in the row of B atoms in the case of an incidence azimuth 2, a large amount of B-atom X-ray is generated. In a case where the C atoms substitute for some of the A atoms, C-atom X-ray is increased when the beam is incident in incidence azimuth 1, while the C-atom X-ray is decreased when the beam is incident in incidence azimuth 2. As just described, the substitution site measurement can be taken by changing the azimuth of the incident electron beam and detecting the X-ray generated from the specimen. The above-described substitution site measurement using the electron beam and the X-ray is devised by Tafφ and Spence in 1982 and is called ALCHEMI (Atom location by channeling-enhanced microanalysis) (Non-patent Literature 1).

CITATION LIST

Non-Patent Literature

Non-patent Literature 1: J. Tafφ and J. C. H. Spence, Ultramicroscopy, 9, 243 (1982)

SUMMARY OF INVENTION

Technical Problem

According to the substitution site measurement using the electron beam, as described above, the measurement of substitution site is taken by utilizing the change in the amount of X-ray generation due to the electron diffraction effect. FIG. 2 shows a specimen with the C atom, as one of dopant elements, present in an atomic layer and an X-ray detector. The X-rays generated from the C atom upon irradiation of the specimen with the electron beam include isotropic X-rays, some of which may be diffracted by atomic layers in the specimen. When K ray of the element C has a diffraction angle θ satisfying an X-ray diffraction condition, for example, X-ray diffraction waves occur. In a case where the X-ray detector is located in the direction of the X-ray diffraction angle θ, a large amount of X-ray signal is detected due to an X-ray diffraction effect. That is, not only the change in the amount of X-ray generation due to the electron diffraction effect but also the increase in the X-ray amount due to the X-ray diffraction effect are detected. This results in a problem that the substitution site measurement on the basis of the change in the amount of X-ray generation due to the electron diffraction effect is decreased in measurement precision.

In order to prevent the decrease in measurement precision due to the X-ray diffraction, it is contemplated to arrange the specimen and the detector in such a positional relation as to circumvent the X-ray diffraction condition. As shown in FIG. 3, an X-ray detector 13 mounted to a transmission electron microscope is disposed between an upper magnetic lens 17a and a lower magnetic lens 17b of an objective lens. It is not practicable to drive the detector because of spatial limitation by the upper magnetic lens 17a and the lower magnetic lens 17b of the objective lens. Therefore, it is practicable to detect the X-ray under a condition where the X-ray diffraction condition is circumvented by changing the tilt of the specimen. Comprehension of a crystal structure of specimen, energy (or wavelength) of X-ray to be detected and a positional relation between the specimen and the X-ray detector is necessary for defining a specimen tilt condition for circumventing the X-ray diffraction condition. In order to circumvent a diffraction condition of incident X-rays, the specimen tilt condition must be determined on the basis of the above-described crystal structure, X-ray energy and positional relation between the specimen and the X-ray detector. The X-ray diffraction condition can be determined on the basis of lattice spacing obtained from the crystal structure, and the X-ray energy. However, the lattice spacing increases as the crystal structure has lower symmetry and becomes more complicated. Further, the X-ray to be detected is more than one and includes K-rays and L-rays. Hence, the energy of the X-rays to be detected increases. This results in a problem that a lot of time is taken to determine the X-ray diffraction condition on the basis of the plural lattice spacings and the X-ray energy.

More recently, the X-ray detector has an increasingly large solid angle for achieving enhanced detection sensitivity. A measure for increasing the solid angle is exemplified by increasing detection area of the X-ray detector or placing the X-ray detector closer to the specimen. Under the condition of large detection solid angle, the substitution site measurement is prone to suffer the invasion of X-rays generated by the X-ray diffraction causing the decrease in measurement precision. That is, a problem exists that it is difficult for the X-ray detector with large solid angle to avoid the diffraction X-ray.

It is an object of the present invention to accomplish substitution site measurement with high precision and in a short time by detecting the X-ray signal in a state where the X-ray diffraction effect in the specimen is reduced or eliminated when the electron beam is used for substitution site measurement in a micrometer-to nanometer-order region.

The above object of the present invention, and other objects and novel features thereof will become apparent from the description thereof and the accompanying drawings.

Solution to Problem

Of the invention disclosed by this application, an outline of typical features thereof is briefly described as below.

According to an aspect of the present invention, a substitution site measuring equipment for taking measurement of a substitution site in a crystal by irradiating a specimen with an electron beam and detecting X-rays emitted from the specimen by means of an X-ray detector, the equipment includes: an input unit for inputting a crystal structure of the specimen, energy or wavelength of X-ray to be detected, an tilt angle of the specimen, and positional information about the specimen and the X-ray detector; a diffraction X-ray incidence calculating means for calculating incidence of diffraction X-ray on the X-ray detector on the basis of parameters inputted to the input unit; a measurement condition setting means for setting a measurement condition according to the incidence of diffraction X-ray on the X-ray detector calculated by the diffraction X-ray incidence calculating means in order to avoid the incidence of the diffraction X-ray on the X-ray detector; and an electron beam inclination/X-ray detection control unit for detecting the X-rays in synchronization with the inclination of electron beam.

According to another aspect of the present invention, a substitution site measuring method which employs a transmission electron microscope and takes measurement of a substitution site in a crystal by irradiating a specimen with an electron beam and detecting X-rays emitted from the specimen by means of an X-ray detector, the method including: a parameter inputting step for inputting a crystal structure of specimen, energy or wavelength of X-ray to be detected, a tilt angle of specimen, and positional information about the specimen and the X-ray detector; a diffraction X-ray incidence calculating step for calculating incidence of diffraction X-ray on the X-ray detector on the basis of the inputted parameters; a measurement condition setting step for setting a measurement condition according to the incidence of diffraction X-ray on the X-ray detector calculated by the diffraction X-ray incidence calculation step in order to avoid the incidence of the diffraction X-ray on the X-ray detector; and an electron beam inclination/X-ray detecting step for detecting the X-rays in synchronization with the inclination of electron beam.

A diffraction angle θ of the X-ray generated in the specimen is determined by using a crystal structure of an evaluation specimen and an energy (or wavelength) of an X-ray to be detected in Bragg equation (1). In the equation 1, "d" denotes a lattice spacing, "λ" denotes a wavelength of X-ray and "n" denotes an integer.

[Equation 1]

$$2d \sin \theta = n\lambda \qquad \text{(equation 1)}$$

A radiation angle (t+θ) of diffraction X-ray can be determined from a tilt angle "t" of specimen and a diffraction angle θ of the diffraction X-ray. Whether or not the diffraction X-ray is incident on the X-ray detector is determined on the basis of the resultant radiation angle of the diffraction X-ray and positional information about the specimen and the X-ray detector.

In the case of a single channel X-ray detector, a display screen of the X-ray detector may be provided with a display means, such as an alarm, for indicating the incidence of the diffraction X-ray when the diffraction X-ray is incident, or a display means for indicating no incidence of diffraction X-ray when the diffraction X-ray is not incident. Thus, an arrangement may be made to allow the operator watching the display screen of the X-ray detector to determine whether or not the diffraction X-ray is incident on the X-ray detector. Further, a specimen tilt condition such as to obviate the incidence of diffraction X-ray on the X-ray detector is calculated to permit the detector to display a range of specimen tilt angle such as to obviate the incidence of diffraction X-ray on the X-ray detector. Otherwise, an arrangement may be made to display, by means of alarm or the like, a range of specimen tilt where the diffraction X-ray is incident on the X-ray detector.

In an X-ray detector having multi-channel position resolution, a display showing whether or not the diffraction X-ray is incident on the X-ray detector is provided. In addition, the X-ray detector may be further provided with a means for displaying a position of the diffraction X-ray on a light receiving surface display thereof so as to indicate an incident position of the diffraction X-ray on the X-ray detector when the diffraction X-ray is incident on the detector. Further, the X-ray detector may be adapted to exclude some of the detecting elements that has detected the diffraction X-ray and to detect the X-ray with only the remaining detecting elements thereof.

Advantageous Effects of Invention

In the substitution site measurement in the microscopic and nanoscopic region using the electron microscope, the present invention permits the X-ray signal to be detected in a state where the X-ray diffraction effect in the specimen is reduced or removed. As a result, the substitution site measurement in the micrometer-to nanometer-order region can be accomplished with high precisions.

BRIEF DESCRIPTION OF DRAWINGS

FIG. 8 is a diagram illustrating a measuring method of the substitution site measuring equipment according to the first embodiment of the present invention.

FIGS. 9A and 9B are a group of diagrams showing an analysis method of the substitution site measuring equipment according to the first embodiment of the present invention.

FIG. 12 is a diagram illustrating an X-ray detector of the substitution site measuring equipment according to the second embodiment of the present invention.

FIG. 13 is a flow chart showing the steps of substitution site measurement according to the second embodiment of the present invention.

DESCRIPTION OF EMBODIMENTS

Figure 1:
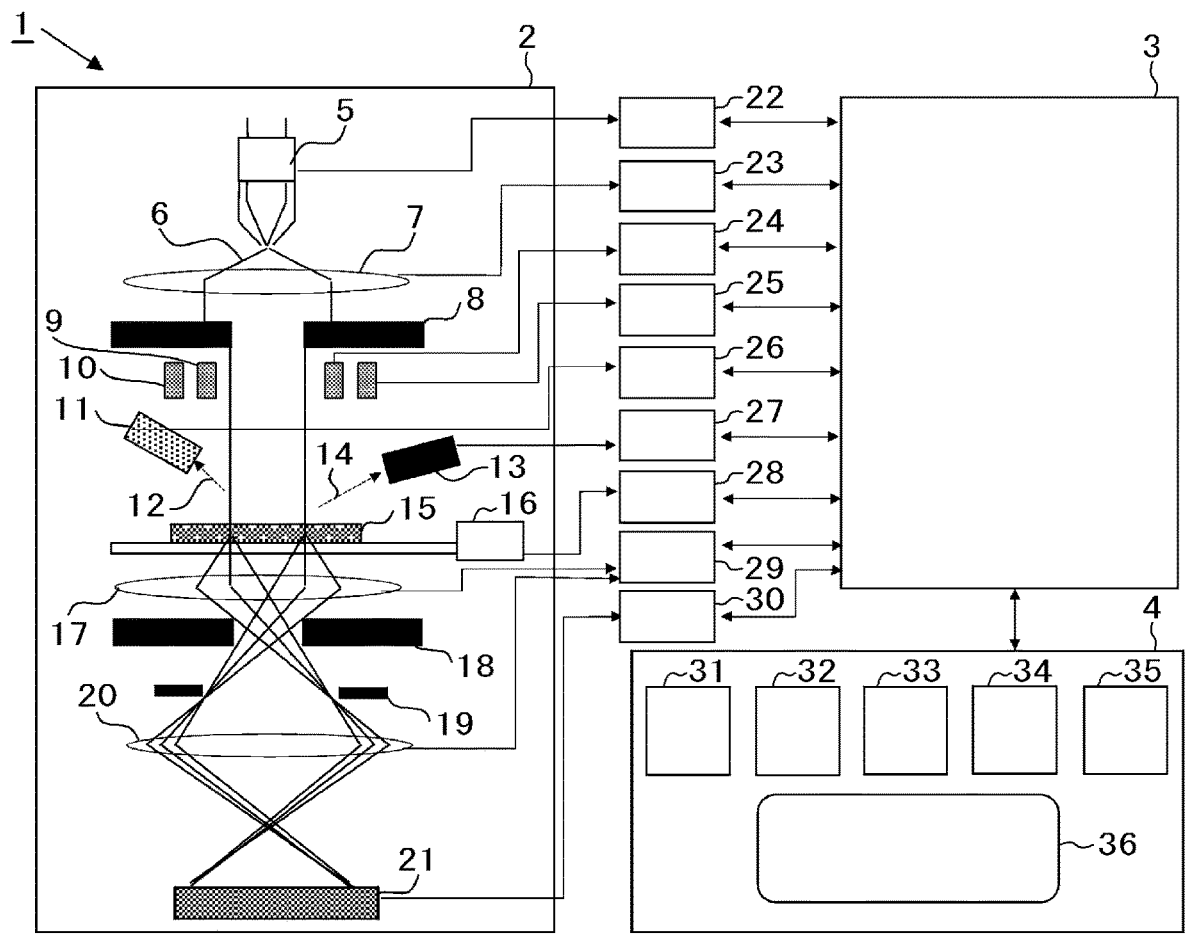
FIG. 1 is a diagram showing a general configuration of a substitution site measuring equipment according to a first embodiment of the present invention.
Figure 2:
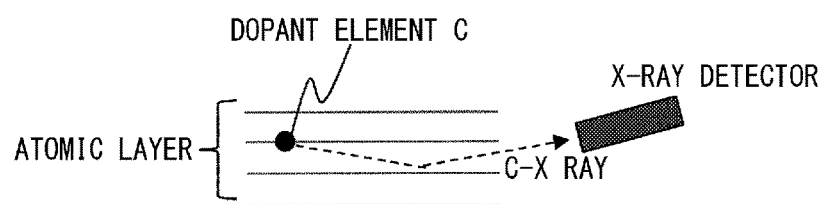
FIG. 2 is a diagram illustrating an X-ray diffraction in a specimen by way of explanation of a problem to be solved by the present invention.

The embodiments of the present invention will hereinbelow be described in detail with reference to the accompanying drawings. In all the figures for illustrating the embodiments, like reference characters essentially refer to the same or corresponding components and the description thereof is dispensed with.

First Embodiment

A first embodiment is described by way of example where substitution site measurement is taken with high precisions by using a transmission electron microscope. FIG. 1 a schematic diagram showing a general configuration of a substitution site measuring equipment according to the first embodiment. A substitution site measuring equipment 1 shown in FIG. 1 includes: a transmission electron microscope 2; a control system 3; and an operation unit 4.

Figure 3:
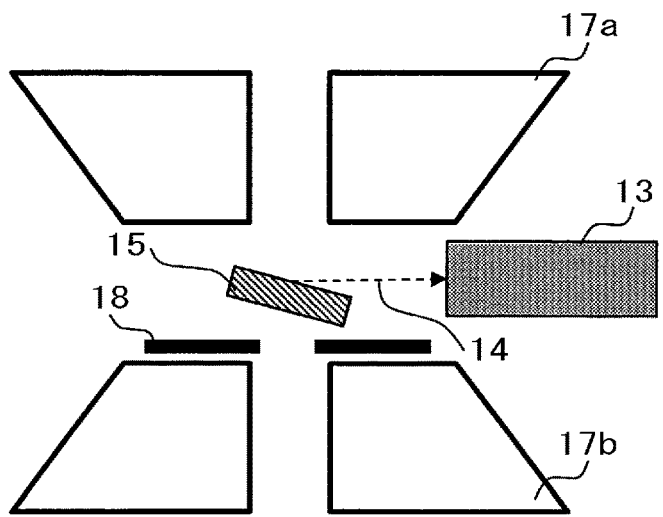
FIG. 3 is a diagram showing a configuration of an area around the specimen in the substitution site measuring equipment according to the first embodiment of the present invention.

The transmission electron microscope 2 includes: an electron gun 5; a condenser lens 7; a condenser aperture 8; an electron beam scanning deflector 9; an electron beam inclination deflector 10; a secondary electron detector 11; an X-ray detector 13; a specimen 15; a specimen holder 16; an objective lens 17; an objective aperture 18; a selector aperture 19; an intermediate lens 20; and an electron beam detector 21. The objective lens 17 is shown as a single lens for simplicity. As shown in FIG. 3, however, the objective lens actually includes an upper magnetic lens 17a and a lower magnetic lens 17b. The specimen 15, the objective aperture 18 located downstream from the specimen 15, and the X-ray detector 13 are disposed between the upper magnetic lens 17a and the lower magnetic lens 17b of the objective lens 17. The intermediate lens 20 disposed between the objective lens 17 and the electron beam detector 21 downstream from the objective lens 17 is shown as a single intermediate lens 20 for simplicity. However, the intermediate lens 20 has a multistage lens configuration including those for focus adjustment, and enlarged image/minified image projection.

The control system 3 includes: an electron gun controller 22; a condenser lens controller 23; an electron beam scanning deflector controller 24; an electron beam inclination deflector controller 25; a secondary electron detector controller 26; an X-ray detector controller 27; a stage controller 28 of specimen holder 16; an objective/intermediate lens controller 29; and an electron beam detector controller 30.

Figure 4:
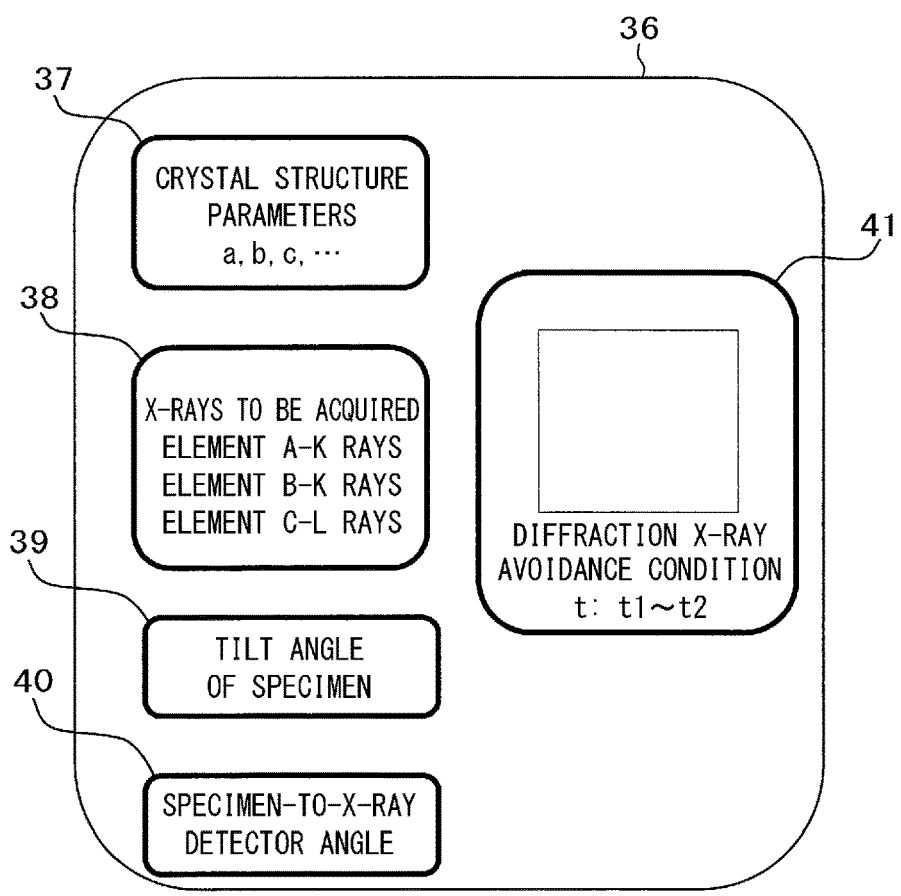
FIG. 4 is a block diagram showing a configuration of an operation unit of the substitution site measuring equipment according to the first embodiment of the present invention.
Figure 5:
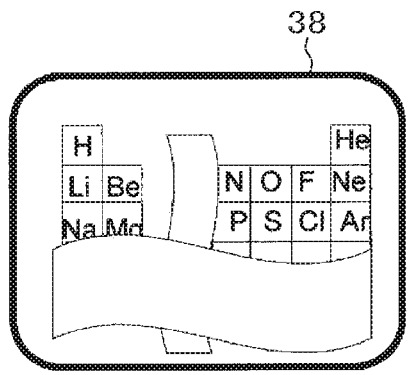
FIG. 5 is a block diagram showing another configuration of the operation unit of the substitution site measuring equipment according to the first embodiment of the present invention.

The operation unit 4 includes: a secondary electron specimen image display unit 31; a specimen projection image display unit 32 for displaying a projection image of specimen detected by the electron beam detector 21; a crystal structure model display unit 33; an X-ray spectrum display unit 34; an X-ray image display unit 35; and a diffraction X-ray analysis/control unit 36. As shown in FIG. 4, the diffraction X-ray analysis/control unit 36 is provided with: a crystal structure entry screen 37 for inputting crystal structure parameters required for calculating diffraction X-ray; an X-ray entry screen 38 for inputting an X-ray to be acquired; a specimen tilt angle entry screen 39; a positional relation entry screen 40 for inputting a positional relation between the specimen 15 and the X-ray detector 13; and an X-ray detector display 41. Based on the abovementioned inputted crystal structure, X-ray to be acquired, specimen tilt angle and positional relation between specimen and X-ray detector, the operation unit performs the calculation of the diffraction X-ray by means of the diffraction X-ray analysis/control unit 36 and displays the resultant diffraction X-ray on the X-ray detector display 41.

Electron beams 6 emitted from the electron gun 5 are collimated by the condenser lens 7 and applied to the specimen 15. The size of the electron beam applied to the specimen 15 can be changed by means of the condenser aperture 8 or excitation current of the condenser lens 7. Under a condition that the size of the electron beam 6 is reduced by boosting the excitation current of the condenser lens 7, the electron beam 6 is applied to the specimen 15 while the secondary electron detector 11 detects secondary electrons 12 emitted from the specimen 15. A secondary electron image is acquired by scanning the electron beam 6 on the specimen 15 by means of the electron beam scanning deflector 9 and detecting the secondary electrons 12 by means of the secondary electron detector 11 in synchronization with the electron beam scanning. The secondary electron image is displayed at the secondary electron image display unit 31. Similarly to the above secondary electron image, an X-ray image can also be acquired by detecting X-rays 14 emitted from the specimen 15 in synchronization with the electron beam scanning. A projection image of the specimen 15 can be formed on the electron beam detector 21 by irradiating the specimen 15 with the collimated electron beams 6 and focusing the transmitted electron beams into an image by means of the objective lens 17 and the intermediate lens 20.

The substitution site measurement is evaluated by inclingly applying the collimated electron beam 6 to the specimen 15 by means of the electron beam inclination deflector 10 and detecting the X-rays 14 emitted from the specimen 15 by means of the X-ray detector 13. An electron beam inclination synchronous X-ray image can be acquired by the X-ray detector 13 which detects the X-rays 14 in synchronization with the inclination of electron beam 6. The electron beam inclination synchronous X-ray image is displayed at the X-ray image display unit 35.

Next, the substitution site measurement of the evaluation specimen 15 is described with reference to a flow chart of FIG. 6, FIG. 1 and FIG. 3 to FIG. 10.

In the first step 101, via the diffraction X-ray analysis/control unit 36 shown in FIG. 4, crystal structure parameters of the evaluation specimen 15 are inputted to the crystal structure entry screen 37; an X-ray to be acquired is inputted to the X-ray entry screen 38; a tilt angle of the specimen is inputted to the specimen tilt angle entry screen 39; an angle between the specimen 15 and the X-ray detector 13 is inputted to the specimen 15-to-X-ray detector 13 positional relation entry screen 40. The X-ray entry screen may be adapted to provide selection from a periodic table shown in FIG. 5.

In the next step 102, the diffraction X-ray analysis/control unit 36 calculates a diffraction angle θ of the to-be-acquired X-ray in the specimen by using Bragg equation (1) in which the crystal structure of the specimen and the to-be-acquired X-ray, as inputted in Step 101, are substituted.

In the next step 103, a radiation direction (θ+t) of the diffraction X-ray emitted from the specimen is determined on the basis of the X-ray diffraction angle θ calculated in Step 102 and the specimen tilt angle "t" inputted in Step 101. Whether or not a diffraction X-ray 14r is incident on the X-ray detector 13 is determined on the basis of the radiation direction (θ+t) of the diffraction X-ray and an angle $t_{det}$ of the X-ray detector. In a case where the diffraction X-ray 14r is incident on the X-ray detector, an alarm indicating the incidence of the diffraction X-ray 14r on the X-ray detector 13 is displayed on the X-ray detector display 41. In a case where the diffraction X-ray 14r is not incident on the X-ray detector, the X-ray detector display 41 does not display the above-described alarm. Otherwise a message "no problem" appears on the X-ray detector display 4. Further, the X-ray detector display 41 is also adapted to indicate a range of specimen tilt angle (t1 to t2) where the diffraction X-ray 14r is not incident on the X-ray detector 13.

It is noted that the steps 102 and 103 are equivalent to a diffraction X-ray incidence calculation step to calculate the incidence of diffraction X-ray on the X-ray detector from the inputted parameters.

Next, the operation proceeds to Step 105 if the diffraction X-ray 14r is not incident on the X-ray detector 13. In a case where the diffraction X-ray 14r is incident on the X-ray detector 13, the operation proceeds to Step 104 where the tilt angle of the specimen is set to a value in the range of specimen tilt angle (t1 to t2) where the diffraction X-ray 14r is not incident on the X-ray detector 13. In this case, an operator of the equipment can operate the equipment accordingly. In addition, the specimen holder controller 28 is also adapted to automatically set the specimen tilt angle in the range of specimen tilt angle (t1 to t2). It is noted that the step 104 is equivalent to a measurement condition setting step where the measurement condition is set according to the incidence of the diffraction X-ray on the X-ray detector as calculated in the diffraction X-ray incidence calculation step, such that the diffraction X-ray is not incident on the X-ray detector.

In the next step 105, the electron beam inclination deflector 10 inclingly applies the collimated electron beam 6 to the specimen 15, while the X-ray detector 13 detects the X-rays 14 emitted from the specimen 15 in synchronization with the inclination of electron beam, as shown in FIG. 8.

Figure 10A:
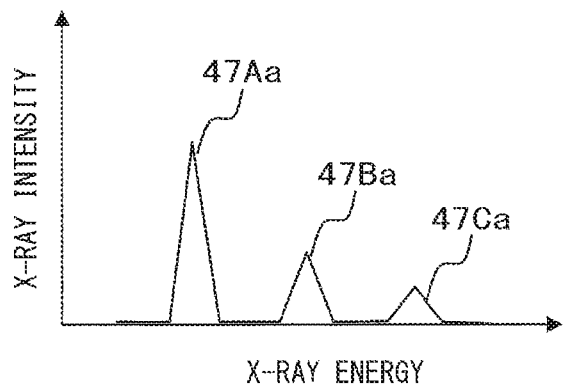
FIGS. 10A and 10B are a group of diagrams corresponding to those of FIG. 9 and showing a relation between X-ray energy and X-ray intensity.
Figure 10B:
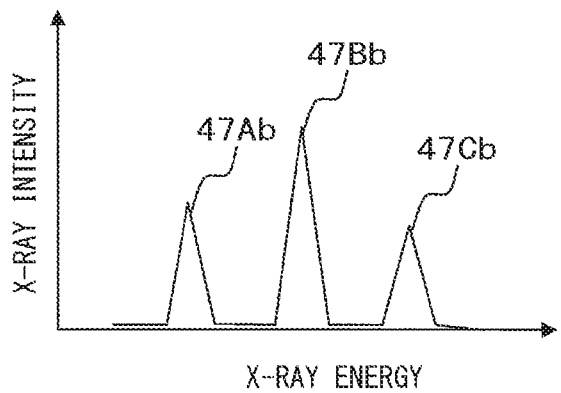

In the next step 106, the substitution structure is analyzed on the basis of the dependency of X-ray spectrum intensity on the inclination of electron beam. As shown in FIG. 9(a), the standing waves are generated in atomic rows of an atom A 46a under the condition that an electron beam 6a is incident on the specimen 15. In an X-ray spectrum 34 detected by the X-ray detector 13, as shown in 10(a), an X-ray intensity 47Aa of an atom A is high while an X-ray intensity 47Ba of an Atom B is low. Further, as shown in FIG. 9(b), the standing waves are generated in atomic rows of an atom B 46b under the condition that an electron beam 6b is incident on the specimen 15. In the X-ray spectrum 34 as shown in 10(b), an X-ray intensity 47Bb of the atom B is high while an X-ray intensity 47Ab of the Atom A is low. On the basis of the dependency of X-ray spectrum intensity on the inclination of electron beam as shown in FIG. 10, it is determined that an atom C substitutes for the atom B because an X-ray intensity 47Cb of the atom C is high when the standing waves are generated in atomic rows of the atom B shown in FIG. 9(b).

In the final Step 107, a substitution structure model obtained in the step 106 is displayed at the crystal structure model display unit 33.

Figure 7:
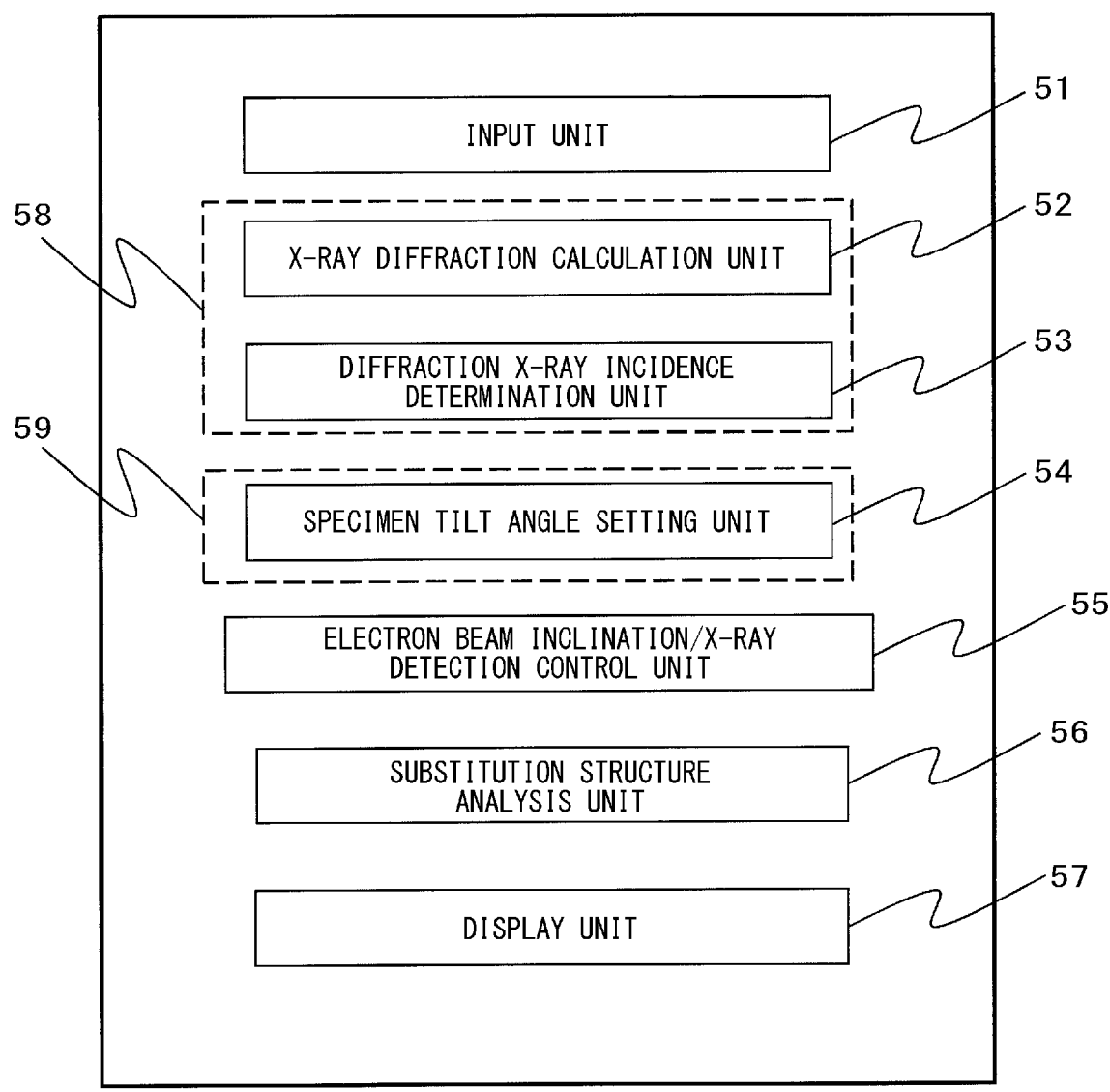
FIG. 7 is a block diagram showing a configuration of a principal part of the substitution site measuring equipment according to the first embodiment of the present invention.

FIG. 7 is a block diagram showing a configuration of a principal part of the substitution site measuring equipment according to the first embodiment of the present invention. The substitution site measuring equipment includes: an input unit 51; an X-ray diffraction calculation unit 52; a diffraction X-ray incidence determination unit 53; a specimen tilt angle setting unit 54; an electron beam inclination/X-ray detection control unit 55; a substitution structure analysis unit 56; and a display unit 57.

The input unit 51 permits the input of crystal structure of specimen; X-ray to be acquired; tilt angle of specimen; and specimen-detection angle. The input unit 51 is equivalent to the crystal structure entry screen 37, the X-ray entry screen 38, the specimen tilt angle entry screen 39, and the specimen-to-X-ray detector positional relation entry screen 40.

The X-ray diffraction calculation unit 52 calculates an X-ray diffraction angle by substituting the crystal structure of specimen and the X-ray to be acquired in Bragg equation. The diffraction X-ray incidence determination unit 53 determines whether or not the diffraction X-ray is incident on the X-ray detector on the basis of the X-ray diffraction angle obtained by the X-ray diffraction calculation unit 52, the tilt angle of specimen, and the specimen-to-detection angle. The X-ray diffraction calculation unit 52 and the diffraction X-ray incidence determination unit 53 are equivalent to a diffraction X-ray incidence calculating means 58 for calculating the incidence of diffraction X-ray on the X-ray detector 13 on the basis of the parameters inputted to the input unit 51.

The specimen tilt angle setting unit 54 sets the tilt angle of specimen to an angle such that the X-ray detector does not detect the diffraction X-ray. The specimen tilt angle setting unit 54 is equivalent to a measurement condition setting means 59 which sets a measurement condition according to the incidence of the diffraction X-ray on the X-ray detector as calculated by the diffraction X-ray incidence calculating means, so as to inhibit the incidence of the diffraction X-ray on the X-ray detector.

The electron beam inclination/X-ray detection control unit 55 detects the X-ray emitted from the specimen in synchronization with the inclination of electron beam.

The substitution structure analysis unit 56 analyzes the substitution structure on the basis of the dependency of X-ray spectrum intensity on the inclination of electron beam.

The display unit 57 displays an obtained substitution structure model. The display unit 57 is equivalent to the crystal structure model display unit 33 shown in FIG. 1.

Figure 6:
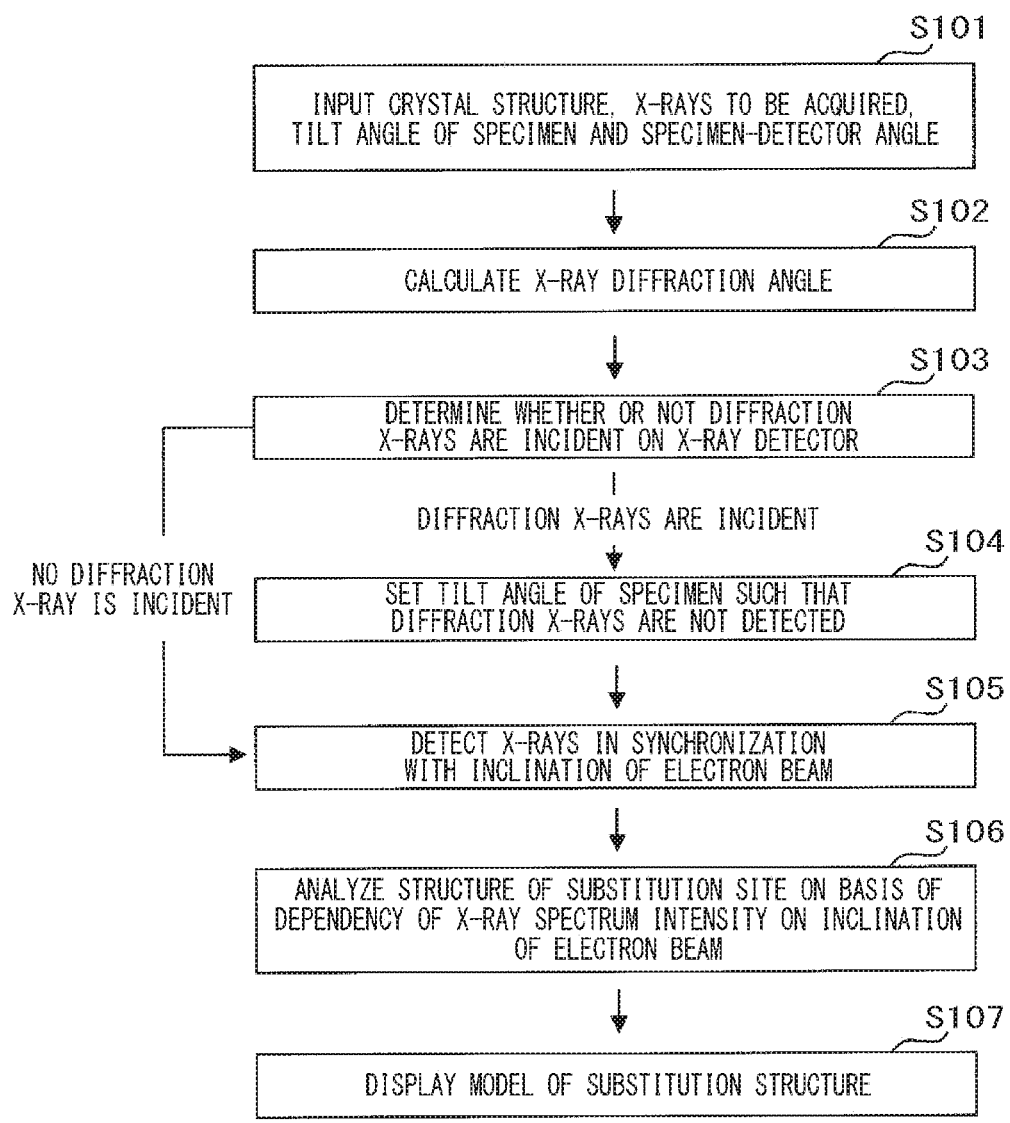
FIG. 6 is a flow chart showing the steps of substitution site measurement according to the first embodiment of the present invention.

The principal part of the substitution site measuring equipment according to this embodiment shown in FIG. 1 includes the input unit, X-ray diffraction calculation unit, diffraction X-ray incidence determination unit, specimen tilt angle setting unit, electron beam inclination/X-ray detection control unit, substitution structure analysis unit and display unit, which are disposed in the operation unit 4 and the like shown in FIG. 1 and correspond to the steps shown in FIG. 6, respectively. These processing units of the substitution site measuring equipment can be configured as software by integrating programs into a computer. Otherwise, each of the processing units can also be configured as a hardware piece.

In conventional X-ray detection without consideration of the diffraction X-ray in specimen, the diffraction X-ray intensity is superimposed on the dependency of X-ray spectrum on the inclination of electron beam, resulting in the decrease in measurement precision. However, the embodiment can detect the change in X-ray intensity solely on the basis of the inclination of electron beam by eliminating the detection of the diffraction X-ray in specimen. Thus, the embodiment provides high-precision measurement of substitution site.

Second Embodiment

A substitution site measuring equipment using the electron beam according to a second embodiment accomplishes high-precision measurement of substitution site by employing, as the X-ray detector 13, a position resolution X-ray detector including a plurality of detecting elements.

Figure 11:
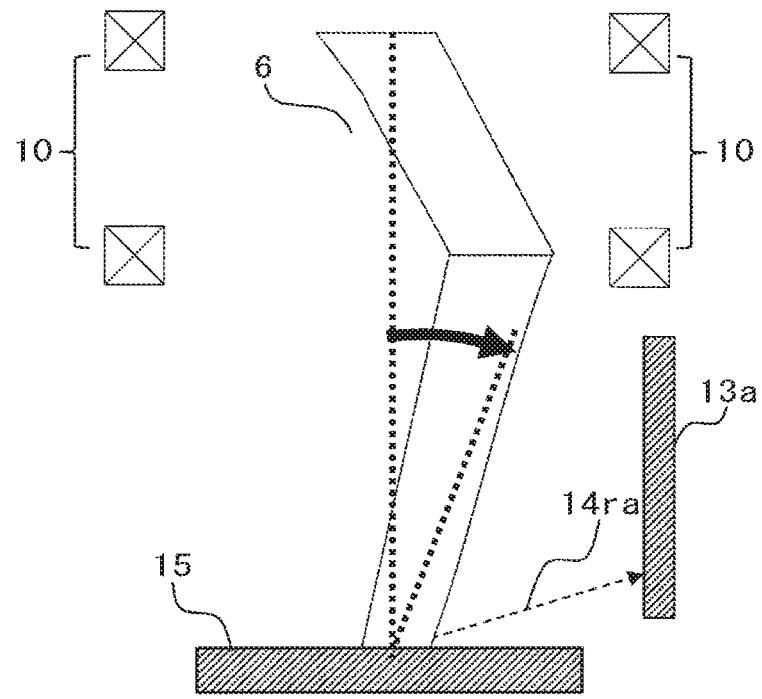
FIG. 11 is a diagram illustrating a measuring method of a substitution site measuring equipment according to a second embodiment of the present invention.

FIG. 11 illustrates a measuring method of the substitution site measuring equipment according to the second embodiment. FIG. 12 illustrates an X-ray detector of the substitution site measuring equipment according to the second embodiment. The equipment has essentially the same configuration as that shown in FIG. 1. As shown in FIG. 11 and FIG. 12, the X-ray detector is an X-ray detector 13a including a plurality of detecting elements 48, each of which is written as follows to be imparted with positional information. A detecting element at position (x, y) is written as "detecting element 48 (x, y)". The X-ray detector 13a, which is capable of detecting an X-ray 14 with the detecting elements 48 (x, y), is a position resolution X-ray detector.

In order to detect the X-ray with high efficiency, the X-ray detector 13 has an increased X-ray detection area or otherwise, the X-ray detector 13 is located closer to the specimen 15. The equipment can achieve sensitive X-ray measurement or shortening of X-ray measuring time by increasing the detection solid angle thereof. However, the increase in the detection solid angle makes it difficult to prevent the incidence of the diffraction X-ray 14r on the X-ray detector 13 by changing the tilt angle of the specimen, as suggested by the first embodiment. With reference to a flow chart of FIG. 13 and FIG. 11 to FIG. 15, description is made on the embodiment where in the case where the detection solid angle is increased, the high-precision measurement of substitution site is accomplished by removing the diffraction X-rays incident on the X-ray detector.

Figure 15:
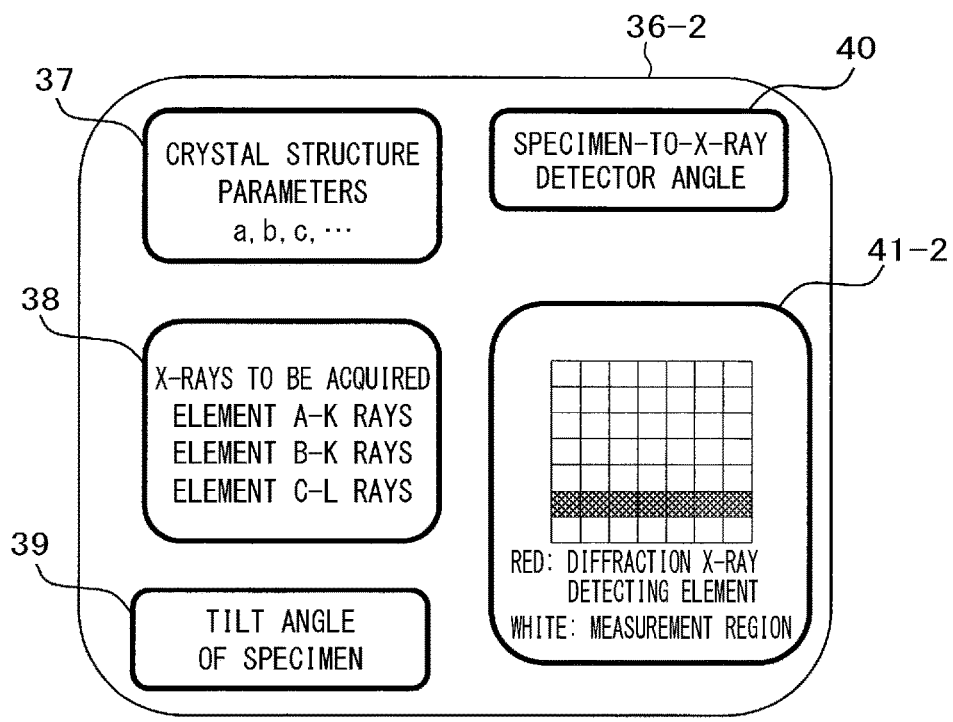
FIG. 15 is a block diagram showing a configuration of an operation unit of the substitution site measuring equipment according to the second embodiment of the present invention.
Figure 16:
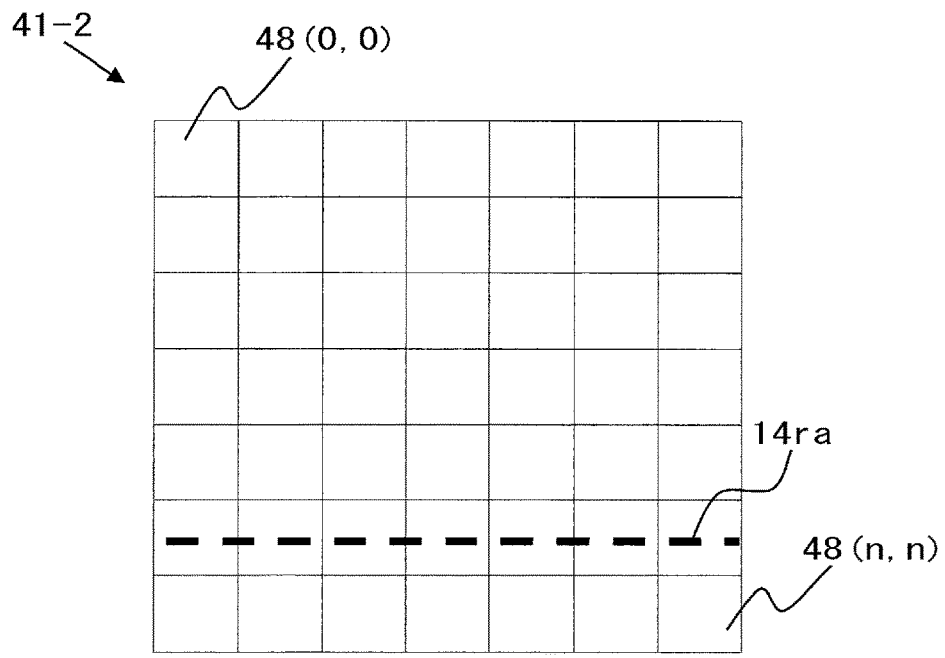
FIG. 16 is a diagram illustrating an X-ray detector display unit of the substitution site measuring equipment according to the second embodiment of the present invention.

In the first step 201, via a diffraction X-ray analysis/control unit 36-2 shown in FIG. 15, crystal structure parameters of the evaluation specimen 15 are inputted to the crystal structure entry screen 37, an X-ray to be acquired is inputted to the X-ray entry screen 38, a tilt angle of the specimen is inputted to the specimen tilt angle entry screen 39, and an angle between the specimen 15 and the X-ray detector 13a is inputted to the specimen 15-to-X-ray detector 13a positional relation entry screen 40.

In the next step 202, the diffraction X-ray analysis/control unit 36 calculates a diffraction angle θ of the to-be-acquired X-ray in the specimen by substituting the crystal structure and the X-ray to be acquired, which were inputted in Step 201, in Bragg equation (1).

In the next step 203, a radiation direction (θ+t) of the diffraction X-ray emitted from the specimen is determined on the basis of the X-ray diffraction angle θ calculated in step 202 and the specimen tilt angle "t" inputted in step 201. Then, an incident position of the diffraction X-ray 14r on the X-ray detecting element 48 in the X-ray detector 13a is determined on the basis of the radiation direction (θ+t) of the diffraction X-ray and the angle $t_{det}$ of the X-ray detector. In a case where a diffraction X-ray 14ra is detected by detecting elements 48(0, n−1) to 48(n, n−1) in the X-ray detector 13a, for example, the diffraction X-ray is displayed in an X-ray detector display screen 41-2, as shown in FIG. 15. Alternatively, red dots or the like signifying alert appear in the X-ray detector display screen 41-2 on the elements 48(0, n−1) to 48(n, n−1) having detected the diffraction X-ray 14ra.

The steps 202 and 203 are equivalent to a diffraction X-ray incidence calculation step to calculate the incidence of diffraction X-ray on the X-ray detector.

In the next step 204, a measurement object exclusion setting is made to exclude the detecting elements 48(0, n−1) to 48(n, n−1) detecting the diffraction X-ray 14ra from the objects of X-ray measurement. The equipment is configured to automatically exclude the detecting elements 48(0, n−1) to 48(n, n−1) displayed in red in step 203 from the X-ray measurement. The step 204 is equivalent to a measurement condition setting step to set a measurement condition according to the incidence of diffraction X-ray on the X-ray detector as calculated in the diffraction X-ray incidence calculation step, so as to inhibit the incidence of diffraction X-ray on the X-ray detector.

In the next step 205, as shown in FIG. 11, the electron beam inclination deflector 10 inclinedly applies the collimated electron beam 6 to the specimen 15, while the X-ray detector 13a detects the X-rays 14ra emitted from the specimen 15 in synchronization with the inclination of electron beam.

In the next step 206, the structure of substitution site is analyzed on the basis of the dependency of X-ray intensity on the inclination of electron beam, just as in the step 106 of the first embodiment.

In the final step 207, the model of substitution structure obtained in Step 206 is displayed on the crystal structure model display unit 33.

Figure 14:
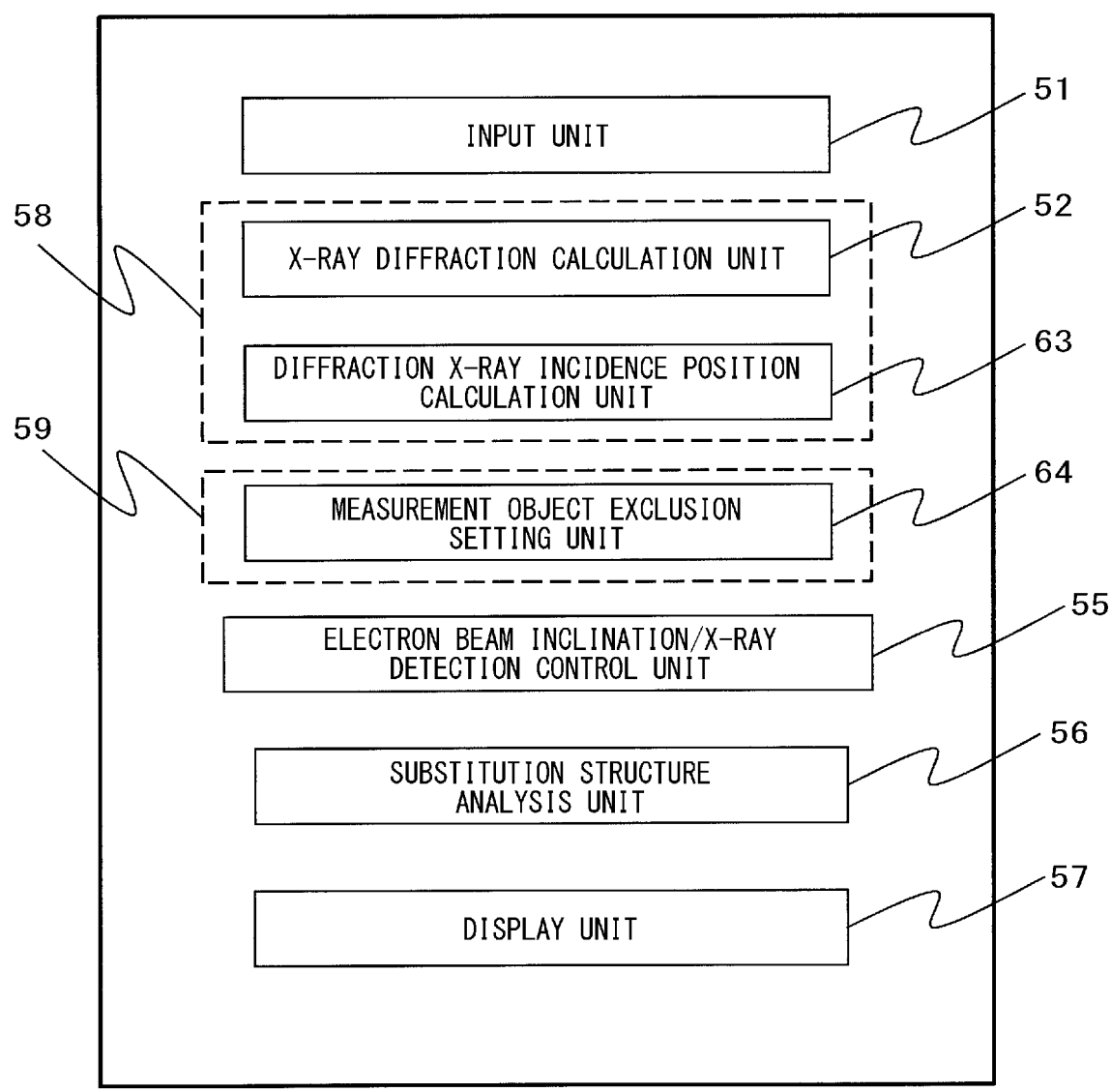
FIG. 14 is a block diagram showing a configuration of a principal part of the substitution site measuring equipment according to the second embodiment of the present invention.

FIG. 14 is a block diagram showing a configuration of a principal part of the substitution site measuring equipment according to the second embodiment of the present invention. The diagram differs from that of FIG. 7 showing the first embodiment in that the measuring equipment includes a diffraction X-ray incidence position calculation unit 63 and a measurement object exclusion setting unit 64.

The diffraction X-ray incidence position calculation unit 63 calculates an incidence position of the diffraction X-ray on the X-ray detector 13a shown in FIG. 12. The measurement object exclusion setting unit 64 sets the exclusion of X-ray detecting element not detecting the diffraction X-ray. The operations of the other components are the same as those of the components shown in FIG. 7.

In this embodiment, the X-ray diffraction calculation unit 52 and the diffraction X-ray incidence position calculation unit 63 are equivalent to the diffraction X-ray incidence calculating means 58 for calculating the incidence of diffraction X-ray on the X-ray detector 13 on the basis of the parameters inputted to the input unit 51. The measurement object exclusion setting unit 64 is equivalent to the measurement condition setting means 59 which sets the measurement condition according to the incidence of the diffraction X-ray on the X-ray detector as calculated by the diffraction X-ray incidence calculating means, so as to inhibit the incidence of the diffraction X-ray on the X-ray detector.

This embodiment can detect the change in X-ray intensity solely on the basis of the inclination of electron beam by eliminating an inevitable detection of the diffraction X-ray in the case where the detection solid angle is increased. Thus, the embodiment provides the high-precision measurement of substitution site.

Third Embodiment

A third embodiment employs the position resolution X-ray detector of the second embodiment so as to analyze the substitution structure with high efficiency while circumventing the influence of X-ray diffraction.

Figure 17:
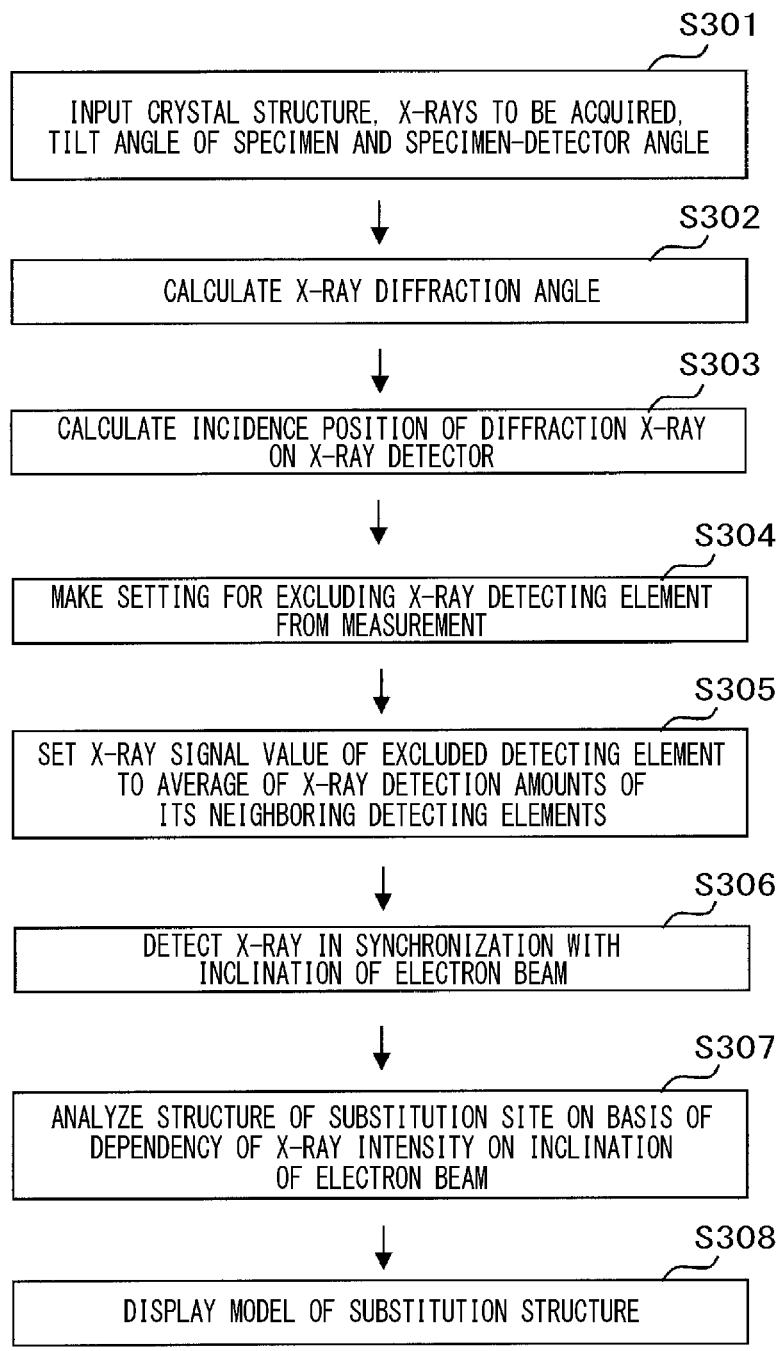
FIG. 17 is a flow chart showing the steps of substitution site measurement according to a third embodiment of the present invention.

FIG. 17 shows a flow of operations of this embodiment. Steps 301 to 304 of the embodiment are the same as the steps 201 to 204 of the second embodiment in which the setting is made to exclude the detecting elements 48(0, n−1) to 48(n, n−1) detecting the diffraction X-ray from the detecting elements for X-ray detection.

In the next step 305, a setting is made such that an X-ray detection amount of the excluded detecting element is set to an average value of the X-ray detection amounts of its neighboring detecting elements that have not detected the diffraction X-ray 14ra. The detecting element subjected to the measurement object exclusion setting is taken in as an X-ray signal amount of the analysis of substitution structure by interpolation with the X-ray signal values of the neighboring detecting elements. This permits the X-ray detection amount of the detecting element excluded in the second embodiment to be also handled as an X-ray signal of the substitution site measurement. Hence, the X-ray amount is increased so that the measurement can be performed with high efficiency.

In the next step 306, the electron beam inclination deflector 10 inclinedly applies the collimated electron beam 6 to the specimen 15, while the X-ray detector 13a detects the X-rays 14 emitted from the specimen 15 in synchronization with the inclination of electron beam.

In the next step 307, the structure of substitution site is analyzed on the basis of the dependency of X-ray intensity on the inclination of electron beam, just as in the step 106 of the first embodiment.

In the final step 308, the model of substitution structure obtained in the step 307 is displayed on the crystal structure model display unit 33.

Figure 18:
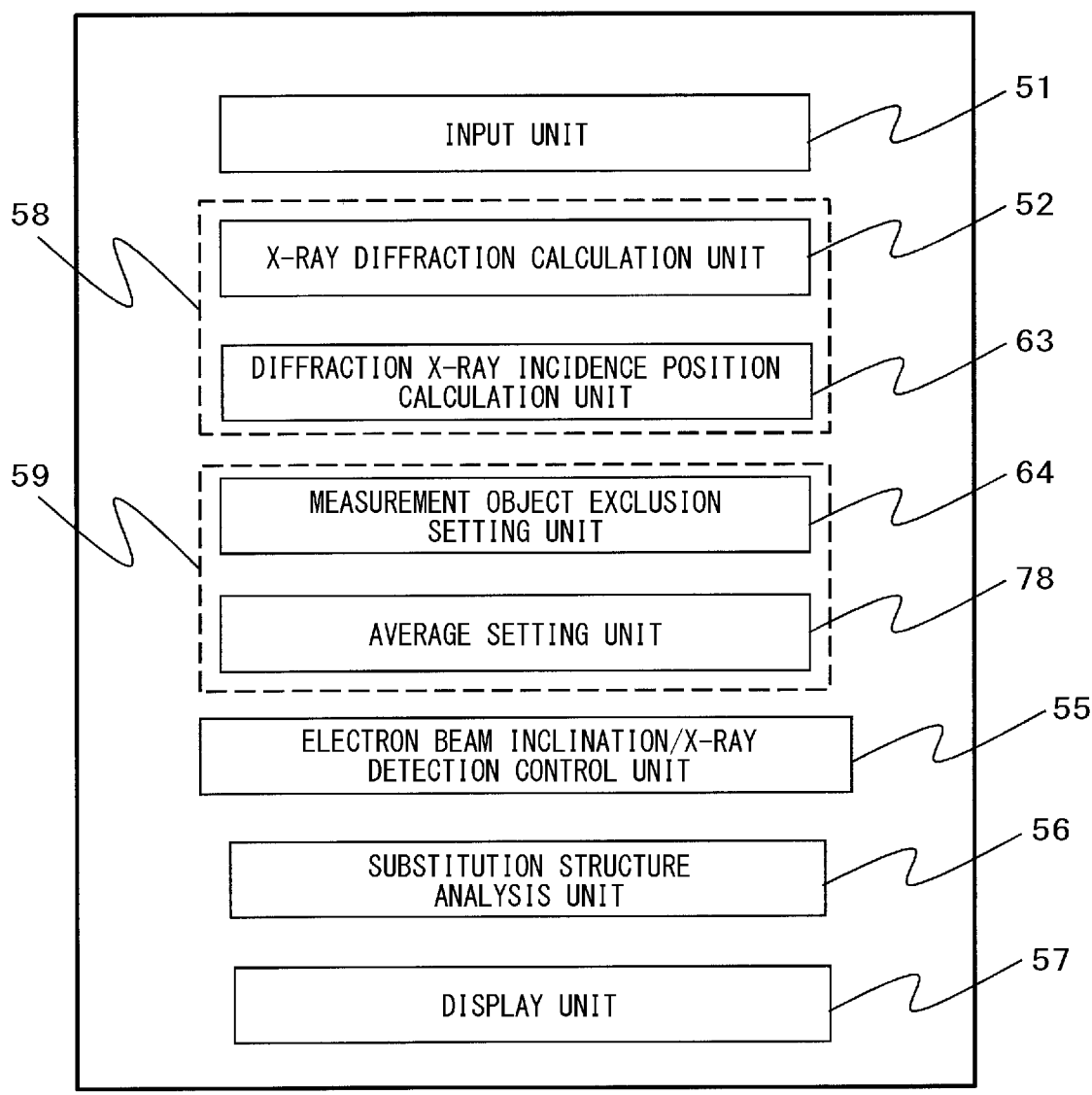
FIG. 18 is a block diagram showing a configuration of a principal part of a substitution site measuring equipment according to the third embodiment of the present invention.
Figure 19:
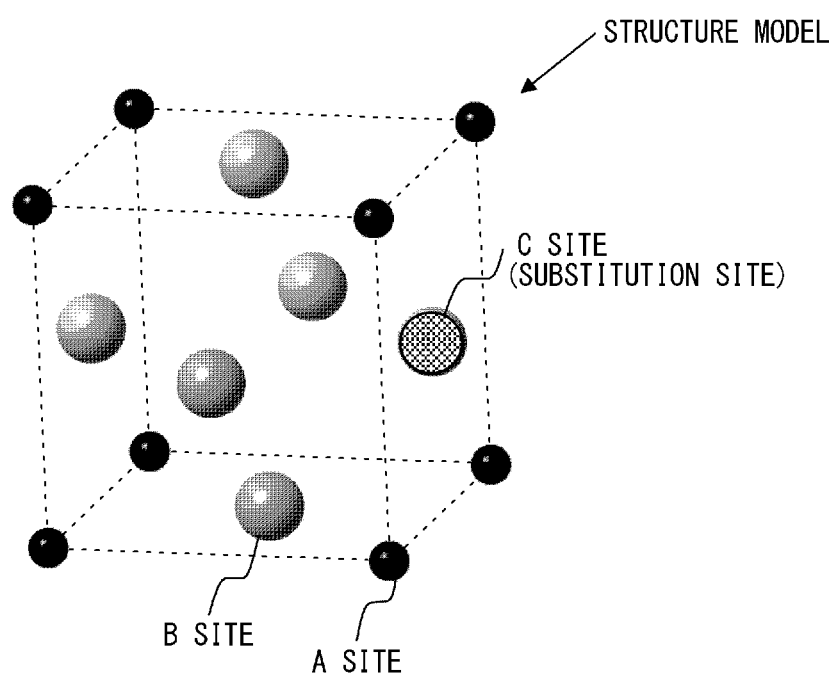
FIG. 19 is a diagram showing an example of crystal structure model including a substitution site.

FIG. 18 is a block diagram showing a configuration of a principal part of the substitution site measuring equipment according to the third embodiment of the present invention. The diagram differs from that of FIG. 14 showing the second embodiment in that the measuring equipment includes an average setting unit 78.

The average setting unit 78 sets the X-ray signal value of the detecting element excluded by the measurement object exclusion setting unit 64 to the average of the X-ray detection amounts of its neighboring detecting elements. The operations of the other components are the same as those of the equipment shown in FIG. 14. In this embodiment, the measurement object exclusion setting unit 64 and the average setting unit 78 are equivalent to the measurement condition setting means 59 which sets the measurement condition according to the incidence of the diffraction X-ray on the X-ray detector as calculated by the diffraction X-ray incidence calculating means, so as to inhibit the incidence of the diffraction X-ray on the X-ray detector.

The embodiment can detect the change in X-ray intensity solely on the basis of the inclination of electron beam by eliminating an inevitable detection of the diffraction X-ray in the case where the detection solid angle is increased. Further, the embodiment handles the X-ray detection amount of the excluded detecting element as the X-ray signal of the substitution site measurement by setting the X-ray detection amount of the excluded X-ray detecting element to the average of the X-ray detection amounts of its neighboring detecting elements. Thus, the embodiment can make the measurement of substitution site with high efficiency and precision.

While the invention created by the inventors has been specifically described with reference to the embodiments thereof, the present invention is not limited to the foregoing embodiments. It goes without saying that various changes or modifications may be made thereto without deviating from the scope of the present invention.

REFERENCE SIGNS LIST

1: substitution site measuring equipment
2: transmission electron microscope
3: control system
4: operation unit
5: electron gun
6: electron beam 7: condenser lens
8: condenser aperture
9: electron beam scanning deflector
10: electron beam inclination deflector
11: secondary electron detector
12: secondary electron
13: X-ray detector
13a: position resolution X-ray detector
14: X-ray
14r: diffraction X-ray
15: specimen
16: specimen holder
17: objective lens
18: objective aperture
19: selector aperture
20: intermediate lens
21: electron beam detector
22: electron gun controller
23: condenser lens controller
24: electron beam scanning deflector controller
25: electron beam inclination deflector controller
26: secondary electron detector controller
27: X-ray detector controller
28: specimen holder controller
29: objective/intermediate lens controller
30: electron beam detector controller
31: secondary electron image display unit
32: specimen projection image display unit
33: crystal structure model display unit
34: X-ray spectrum display unit
35: X-ray image display unit
36: diffraction X-ray analysis/control unit
37: crystal structure entry screen
38: X-ray entry screen
39: specimen tilt angle entry screen
40: specimen-X-ray detector positional relation entry screen
41: X-ray detector display
48: X-ray detecting element of position resolution X-ray detector
51: input unit
52: X-ray diffraction calculation unit
53: diffraction X-ray incidence determination unit
54: specimen tilt angle setting unit
55: electron beam inclination/X-ray detection control unit
56: substitution structure analysis unit
57: display unit
58: diffraction X-ray incidence calculating means
59: measurement condition setting means
63: diffraction X-ray incidence position calculation unit
64: measurement object exclusion setting unit
78: average setting unit

The invention claimed is:

1. A substitution site measuring equipment for taking measurement of a substitution site in a crystal by irradiating a specimen with an electron beam and detecting X-rays emitted from the specimen by means of an X-ray detector, the equipment comprising:
an input unit for inputting a crystal structure of the specimen, energy or wavelength of X-ray to be detected, a tilt angle of the specimen, and positional information about the specimen and the X-ray detector;
a diffraction X-ray incidence calculating means for calculating incidence of diffraction X-ray on the X-ray detector on the basis of parameters inputted to the input unit;
a measurement condition setting means for setting a measurement condition according to the incidence of diffraction X-ray on the X-ray detector calculated by the diffraction X-ray incidence calculating means in order to avoid the incidence of the diffraction X-ray on the X-ray detector; and
an electron beam inclination/X-ray detection control unit for detecting the X-rays in synchronization with an inclination of the electron beam;
a substitution structure analysis unit for analyzing a structure of the substitution site based on dependency of a detected X-ray spectrum intensity on the inclination of the electron beam, wherein standing waves are generated in atomic rows of the crystal when the electron beam is incident on the specimen; and
a display unit for displaying an analyzed structure of the substitution site.

2. The substitution site measuring equipment according to claim 1,
wherein the diffraction X-ray incidence calculating means includes:
an X-ray diffraction calculation unit for calculating an X-ray diffraction angle on the basis of the crystal structure of specimen, and the energy or wavelength of X-ray to be detected; and
an incidence determination unit for determining whether or not the diffraction X-ray is incident on the X-ray detector on the basis of the calculated X-ray diffraction angle, the tilt angle of specimen and the positional information about the specimen and the X-ray detector, and
the measurement condition setting means includes a specimen tilt angle setting unit for setting the tilt angle of specimen to an angle that avoids the detection of the diffraction X-ray.

3. The substitution site measuring equipment according to claim 2,
wherein the X-ray detector is a single channel X-ray detector.

4. The substitution site measuring equipment according to claim 2, further comprising a means for displaying a radiation direction of the diffraction X-ray.

5. The substitution site measuring equipment according to claim 1,
wherein the X-ray detector is a position resolution X-ray detector including a plurality of X-ray detecting elements,
the diffraction X-ray incidence calculating means includes:
an X-ray diffraction calculation unit for calculating an X-ray diffraction angle on the basis of the crystal structure of specimen and the energy or wavelength of X-ray to be detected; and
an incidence position calculation unit for calculating an incidence position of the diffraction X-ray on the X-ray detector on the basis of the calculated X-ray diffraction angle, the tilt angle of specimen and the positional information about the specimen and the X-ray detector; and
the measurement condition setting means includes a measurement object exclusion setting unit for excluding, from measurement, an X-ray detecting element on which the diffraction X-ray is incident.

6. The substitution site measuring equipment according to claim 5, further comprising a means for displaying an incidence position of the diffraction X-ray on the X-ray detector.

7. The substitution site measuring equipment according to claim 1, wherein the X-ray detector is a position resolution X-ray detector including a plurality of X-ray detecting elements, the diffraction X-ray incidence calculating means includes:

an X-ray diffraction calculation unit for calculating an X-ray diffraction angle on the basis of the crystal structure of specimen and the energy or wavelength of X-ray to be detected; and an incidence position calculation unit for calculating an incidence position of the diffraction X-ray on the X-ray detector on the basis of the calculated X-ray diffraction angle, the tilt angle of specimen and the positional information about the specimen and the X-ray detector, and the measurement condition setting means includes:

a measurement object exclusion setting unit for excluding, from measurement, an X-ray detecting element on which the diffraction X-ray is incident; and an average setting unit for setting an X-ray signal value of the X-ray detecting element excluded by the measurement object exclusion setting unit to an average of X-ray detection amounts of its neighboring detecting elements.

8. The substitution site measuring equipment according to claim 1, wherein the input unit includes: a crystal structure entry screen for inputting crystal structure parameters; an X-ray entry screen for inputting X-ray to be acquired; a specimen tilt angle entry screen; and a positional relation entry screen for inputting a positional relation between the specimen and the X-ray detector.

9. The substitution site measuring equipment according to claim 8, wherein the X-ray entry screen is for selection from a periodic table of elements.

10. A substitution site measuring method which employs a transmission electron microscope and takes measurement of a substitution site in a crystal by irradiating a specimen with an electron beam and detecting X-rays emitted from the specimen by means of an X-ray detector, the method comprising:

a parameter inputting step for inputting a crystal structure of specimen, energy or wavelength of X-ray to be detected, a tilt angle of specimen, and positional information about the specimen and the X-ray detector;

a diffraction X-ray incidence calculating step for calculating incidence of diffraction X-ray on the X-ray detector on the basis of the inputted parameters;

a measurement condition setting step for setting a measurement condition according to the incidence of diffraction X-ray on the X-ray detector calculated by the diffraction X-ray incidence calculation step in order to avoid the incidence of the diffraction X-ray on the X-ray detector; and an electron beam inclination/X-ray detecting step for detecting the X-rays in synchronization with an inclination of the electron beam;

an analyzing step for analyzing a structure of substitution site on the basis of dependency of X-ray spectrum intensity on the inclination of electron beam, wherein standing waves are generated in atomic rows of the crystal when the electron beam is incident on the specimen; and a displaying step for displaying an analyzed structure of substitution site.

11. The substitution site measurement method according to claim 10, wherein the diffraction X-ray incidence calculating step includes:

an X-ray diffraction calculating step for calculating an X-ray diffraction angle on the basis of the crystal structure of specimen, and the energy or wavelength of X-ray to be detected; and an incidence determination step for determining whether or not the diffraction X-ray is incident on the X-ray detector on the basis of the calculated X-ray diffraction angle, the tilt angle of specimen and the positional information about the specimen and the X-ray detector, and the measurement condition setting step includes a specimen tilt angle setting step for setting the tilt angle of specimen to an angle that avoids the detection of the diffraction X-ray.

12. The substitution site measurement method according to claim 10, wherein the X-ray detector is a position resolution X-ray detector including a plurality of X-ray detecting elements, the diffraction X-ray incidence calculating step includes:

an X-ray diffraction calculating step for calculating an X-ray diffraction angle on the basis of the crystal structure of specimen, the energy or wavelength of X-ray to be detected; and an incidence position calculating step for calculating an incidence position of the diffraction X-ray on the X-ray detector on the basis of the calculated X-ray diffraction angle, the tilt angle of specimen and the positional information about the specimen and the X-ray detector, and the measurement condition setting step includes a measurement object exclusion setting step for excluding, from measurement, an X-ray detecting element on which the diffraction X-ray is incident.

13. The substitution site measurement method according to claim 10, wherein the X-ray detector is a position resolution X-ray detector including a plurality of X-ray detecting elements, the diffraction X-ray incidence calculating step includes:

an X-ray diffraction calculating step for calculating an X-ray diffraction angle on the basis of the crystal structure of specimen, the energy or wavelength of X-ray to be detected; and an incidence position calculating step for calculating an incidence position of the diffraction X-ray on the X-ray detector on the basis of the calculated X-ray diffraction angle, the tilt angle of specimen and the positional information about the specimen and the X-ray detector, and the measurement condition setting step includes:

a measurement object exclusion setting step for excluding, from measurement, an X-ray detecting element on which the diffraction X-ray is incident, and an average setting step for setting an X-ray signal value of the X-ray detecting element excluded by the measurement object exclusion setting step to an average of the X-ray detection amounts of its neighboring detecting elements.

* * * * *